United States Patent [19]

Chang et al.

[11] Patent Number: 5,788,567
[45] Date of Patent: Aug. 4, 1998

[54] APPARATUS FOR GUIDING AIR CURRENT OF EQUIPMENT USED IN CLEAN ROOM

[75] Inventors: Shieh-Ming Chang, Chia-Yi; Wen-Hong Lee, Hsin-Chu; Jun-Ming Chen, Tainan, all of Taiwan

[73] Assignee: Mosel Vitelic Inc., Hsinchu, Taiwan

[21] Appl. No.: 603,056

[22] Filed: Feb. 16, 1996

[51] Int. Cl.$^6$ .................................................. H05K 5/00
[52] U.S. Cl. ............................................................. 454/187
[58] Field of Search .................................... 454/187, 230, 454/184; 55/385.4, 385.6; 361/695, 678

[56] References Cited

U.S. PATENT DOCUMENTS

| | | | |
|---|---|---|---|
| 4,435,195 | 3/1984 | Testone | 55/126 |
| 4,603,618 | 8/1986 | Soltis | 454/230 |
| 4,751,872 | 6/1988 | Lawson, Jr. | 361/687 |
| 4,889,542 | 12/1989 | Hayes | 55/97 |
| 5,267,121 | 11/1993 | Uchida et al. | 361/694 |
| 5,460,571 | 10/1995 | Kato et al. | 454/184 |
| 5,526,228 | 6/1996 | Dickson et al. | 361/695 |

*Primary Examiner*—Harold Joyce
*Assistant Examiner*—Derek S. Boles
*Attorney, Agent, or Firm*—Pennie & Edmonds LLP

[57] ABSTRACT

An apparatus for the guiding an air current of equipment used in a clean room is disclosed which comprises a chassis for protecting the equipment, a cooling fan for bringing warm air generated inside the chassis, and a guiding panel being attached on one side of the chassis for guiding the warm air brought by the cooling fan to conform downwards to the direction of the vertical air flow in a clean room for reducing particulate contamination. The present invention also provides a way for preventing buidup of static charges on the equipment.

10 Claims, 2 Drawing Sheets

APPARATUS FOR GUIDING AIR CURRENT OF EQUIPMENT USED IN CLEAN ROOM

BACKGROUND OF THE INVENTION

1. Field of the Invention

The present invention relates to an apparatus for guiding the current brought by the cooling fan of equipment, and more particularly to an apparatus for guiding the current of equipment used in a clean room.

2. Description of the Prior Art

Due to the small feature size, which are usually in the micron or sub-micron range, and the thinness of deposited layers on the substrate surface of very large scale integrated (VLSI) circuits, semiconductor devices are very vulnerable to particulate contamination in the air, coming from panel, present in process chemicals, and generated by equipment.

Another major type of contaminants is mobile ionic contaminant, atom of metal that exists in the material in an ionic form, which will change the device characteristics due to moving of the ion before or after packaging. The contamination described hereinabove will consequently affect the device yield, the device performance and the device reliability, which make the contamination control a critical technology in the VLSI era.

Airborne particles, often referred to as particulates or aerosols, cause a major problem of contamination in a clean room. According to a standard in Federal Standard 209B, see "Clean Room and Work Station Requirement, Federal Standard 209B, Sec. 1–5, Apr. 24, 1973, Office of Technical Services, Dept. of Commerce, Washington, D.C.", air quality is designated by a class number, which is defined as the number of particles above a specified diameter in a cubic foot of air. Table 1 below lists some class numbers and their corresponding particle size for various environments.

TABLE 1

| Environment | Class number | Particle size, µ |
|---|---|---|
| VLSI area | 10 | 0.3 |
| VLF Hood | 100 | 0.5 |
| Assembly area | 10,000 | 0.5 |
| House room | 100,000 | |
| Outdoor | >500,000 | |

FIG. 1 illustrates an arragement of a modern clean room, which can perform at class 10 or better conditions. The filters 12, referred to high-efficiency particulate attenuation (HEPA) filters in the ceiling, are constructed of fragile fibers with many small holes and folded into the filter holder in an accordion pattern, which allow the passage of large columns of air at low velocity by not causing air currents. Air is drawn from rooms 14 through fans 16, and forced through the filter 12 in a vertical laminar flow (VLF) pattern. Then air returns to the rooms 14 through a perforated floor 18.

Although the filters in the ceiling of a clean room effectively reduce particulate contamination, a type of particles generated by equipment is still a major vulnerability of semiconductor devices. Most of the particles generated by machines, such as computers or test equipment, are caused by air currents owing to the cooling fans inside the machines. As shown in FIG. 2, those air currents 23 coming out from back or side perforated panel 21, and leaking out from disjointed chassis 22 usually do not conform to the direction of the vertical laminar flow in the clean room, causing small turbulence enough to increase the particulate contamination. There is no effective way to solve this problem except that disjointed holes of chassis are passively blocked.

SUMMARY OF THE INVENTION

It is therefore a primary object of this invention to provide an apparatus for guiding the air current brought by the cooling fan of equipment used in a clean room.

It is another object of the invention to provide an apparatus for guiding the warm air brought by the cooling fan to conform downwards to the direction of the vertical air flow in the clean room.

It is a further object of the invention to provide a way for preventing buidup of static charges on the equipment.

Accordingly, the present invention provides an apparatus for guiding the air current of equipment used in a clean room, the apparatus comprising a chassis for protecting the equipment, a cooling fan for bringing warm air generated inside the chassis, and a guiding panel, which is preferably made of antistatic material, being attached on one side of the chassis for guiding the warm air brought by the cooling fan to conform downwards to the direction of the vertical air flow in a clean room. The apparatus preferably further utilizes an ionizing grid placed between the chassis and the guiding panel, a grounded static-discharge line secured to the guiding panel, or an antistatic solution applied to the guiding panel for preventing buidup of static charges.

DESCRIPTION OF THE PREFERRED EMBODIMENTS

Figure 1:
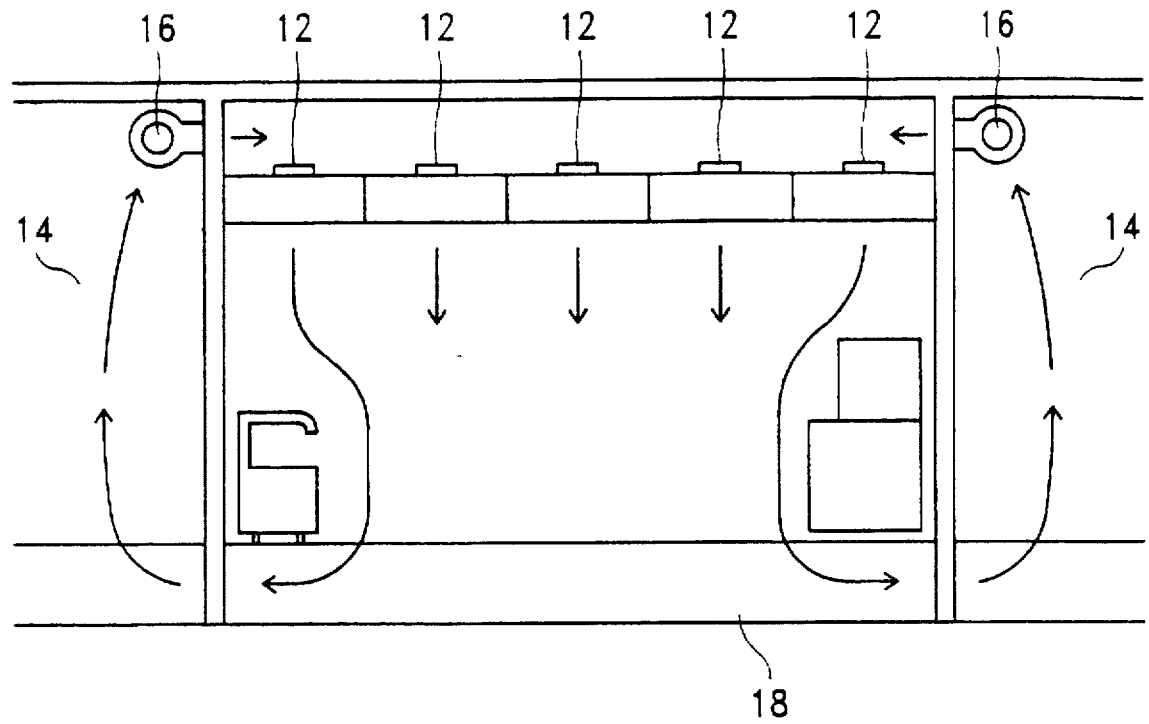
FIG. 1 illustrates an arragement of a modern clean room.
Figure 2:
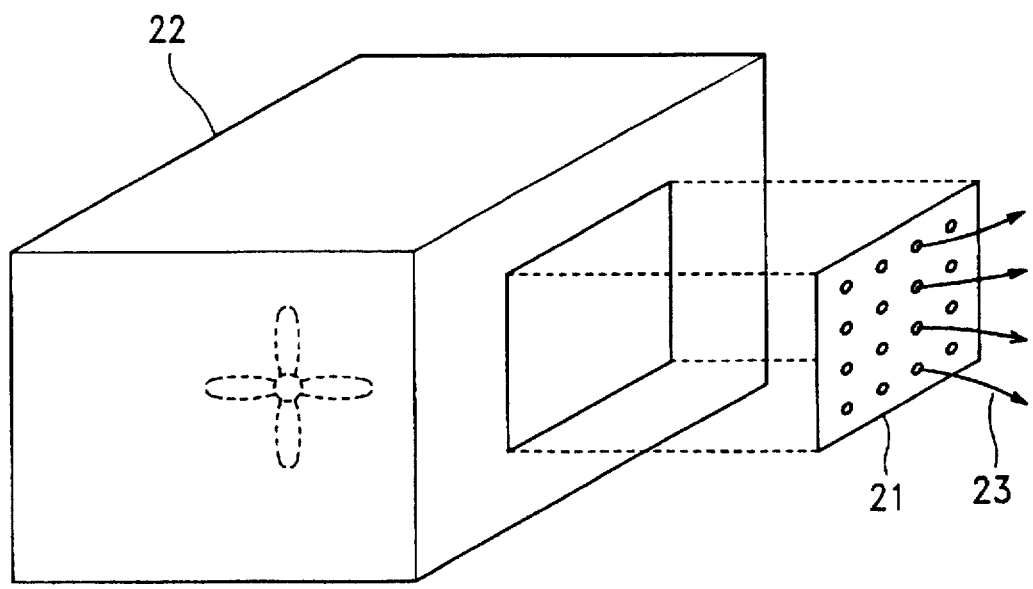
FIG. 2 shows a machine for guiding warm air in a conventional clean room.
Figure 3:
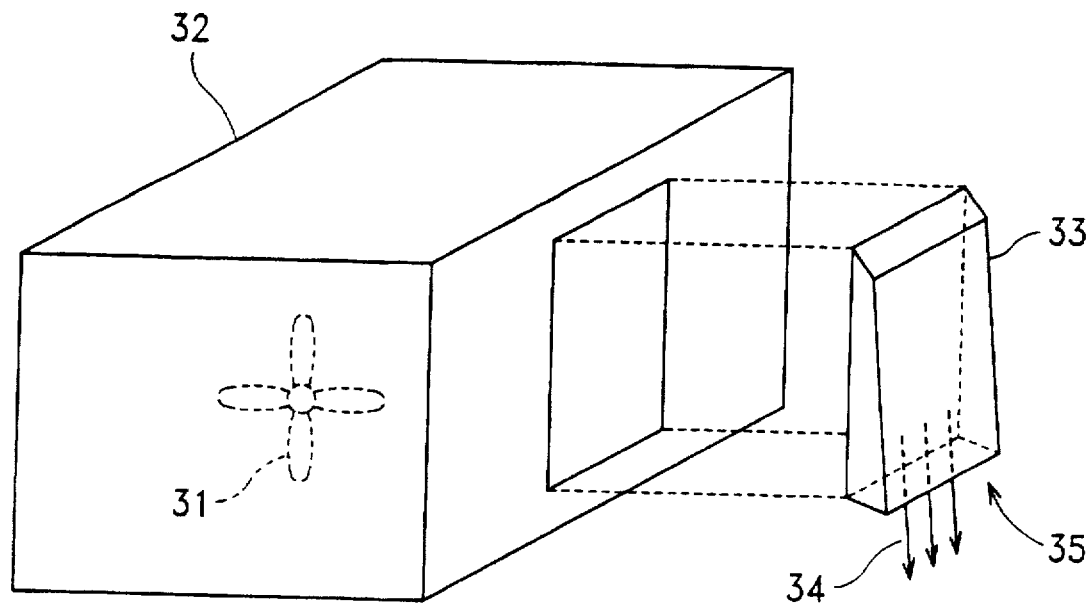
FIG. 3 is a preferred embodiment of the present invention.

FIG. 3 illustrates a preferred embodiment of the present invention. A cooling fan 31 enclosed in a protective chassis 32 of a machine, such as a computer or a test machine, brings warm air which is guided by a guiding panel 33 attached on one side of the chassis 32. The guiding panel 33 is secured to the chassis 32 on upper, left and right sides, but only open on bottom side. Consequently the air current 34 guiding by the guiding panel 33 conforms downwards to the direction of the vertical air flow in a clean room, making turbulence impossible to occur. Thus, as shown in FIG. 3, the warm air 34 exits through a rectangular opening 35 which is oriented substantially perpendicular to the vertical direction of air flow. For a better result, the angle formed by the guiding panel 33 with vertical is between 30°–45°.

Figure 4:
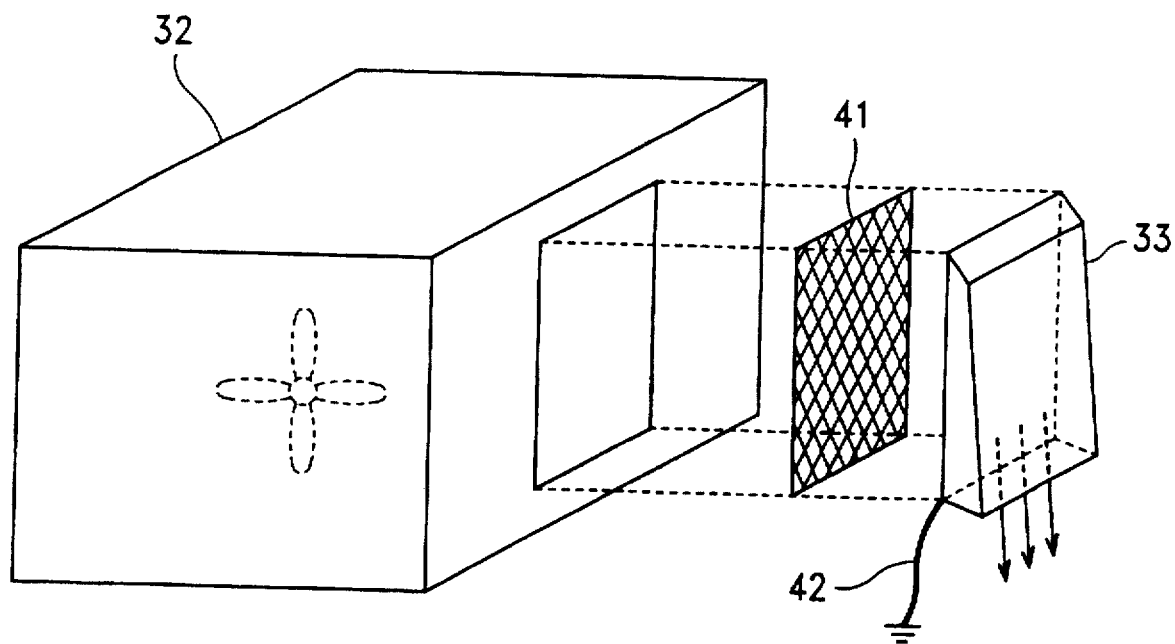
FIG. 4 shows some techniques to prevent buildup of static charges.

Owing to the vulnerability of the devices to smaller particles of contamination in fabricating very large scale integrated circuits, static charges become one of the major sources of particulate contamination. The static charges built up on the wafers, the work surfaces, and equipment can carry static charges as high as 50,000 volts, ending up destroying the circuits. The present invention controls this problem by using discharge techniques, which include the use of a guiding panel 33 made of antistatic material as shown in FIG. 4, and an antistatic solution applied to the guiding panel 33. Static discharge is also practiced by inserting an ionizing grid 41 between the chassis 32 and the guiding panel 33, or securing a grounded static-discharge line 42 to the guiding panel 33.

The present invention has been practiced in a Hitachi NEM machine, an electronic microscope in a clean room.

The tables 2A to 2D and the tables 3A to 3D shown below are the measurements of accumulated particles for different particle size and different locations before and after respectively the present invention is utilized, illustrating a great deal of reduction in particulate contamination.

TABLE 2A

| Size, μm | Accum. No |
|---|---|
| 0.10 | 4 |
| 0.15 | 2 |
| 0.20 | 0 |
| 0.25 | 0 |
| 0.30 | 0 |
| 0.50 | 0 |
| 0.70 | 0 |
| 1.00 | 0 |

TABLE 2B

| Size, μm | Accum. No |
|---|---|
| 0.10 | 3 |
| 0.15 | 2 |
| 0.20 | 1 |
| 0.25 | 0 |
| 0.30 | 0 |
| 0.50 | 0 |
| 0.70 | 0 |
| 1.00 | 0 |

TABLE 2C

| Size, μm | Accum. No |
|---|---|
| 0.10 | 0 |
| 0.15 | 0 |
| 0.20 | 0 |
| 0.25 | 0 |
| 0.30 | 0 |
| 0.50 | 0 |
| 0.70 | 0 |
| 1.00 | 0 |

TABLE 2D

| Size, μm | Accum. No |
|---|---|
| 0.10 | 5 |
| 0.15 | 4 |
| 0.20 | 4 |
| 0.25 | 4 |
| 0.30 | 3 |
| 0.50 | 0 |
| 0.70 | 0 |
| 1.00 | 0 |

TABLE 3A

| Size, μm | Accum. No |
|---|---|
| 0.10 | 0 |
| 0.15 | 0 |
| 0.20 | 0 |
| 0.25 | 0 |
| 0.30 | 0 |
| 0.50 | 0 |
| 0.70 | 0 |
| 1.00 | 0 |

TABLE 3B

| Size, μm | Accum. No |
|---|---|
| 0.10 | 4 |
| 0.15 | 3 |
| 0.20 | 3 |
| 0.25 | 3 |
| 0.30 | 2 |
| 0.50 | 1 |
| 0.70 | 0 |
| 1.00 | 0 |

TABLE 3C

| Size, μm | Accum. No |
|---|---|
| 0.10 | 0 |
| 0.15 | 0 |
| 0.20 | 0 |
| 0.25 | 0 |
| 0.30 | 0 |
| 0.50 | 0 |
| 0.70 | 0 |
| 1.00 | 0 |

TABLE 3D

| Size, μm | Accum. No |
|---|---|
| 0.10 | 0 |
| 0.15 | 0 |
| 0.20 | 0 |
| 0.25 | 0 |
| 0.30 | 0 |
| 0.50 | 0 |
| 0.70 | 0 |
| 1.00 | 0 |

What is claimed is:

1. An apparatus for guiding an air current of equipment, the apparatus comprising:

a chassis for protecting equipment therein;

a cooling fan for bringing warm air generated inside the chassis; and a guiding panel being attached on one side of the chassis for guiding the warm air brought by the cooling fan downwards, being secured to the chassis on upper, left and right sides, and being open on bottom side, wherein said guiding panel is made of antistatic material.

2. The apparatus of claim 1, wherein an antistatic solution is applied to said guiding panel for preventing buildup of static charges.

3. The apparatus of claim 1, wherein the angle formed by said guiding panel with vertical is between 30°–45°.

4. An apparatus for guiding an air current of equipment, the apparatus comprising:

a chassis for protecting equipment therein;

a cooling fan for bringing warm air generated inside the chassis; and a guiding panel being attached on one side of the chassis for guiding the warm air brought by the cooling fan downwards, being secured to the chassis on upper, left and right sides, and being open on bottom side, wherein an antistatic solution is applied to said guiding panel for preventing buildup of static charges.

5. The apparatus of claim 4, wherein the angle formed by said guiding panel with vertical is between 30°–45°.

6. An apparatus for guiding an air current of equipment used in a clean room, the apparatus comprising:
- a chassis for protecting equipment therein;
- a cooling fan for bringing warm air generated inside the chassis;
- a guiding panel being attached on one side of the chassis for guiding the warm air brought by the cooling fan to conform downwards to the direction of a vertical air flow in the clean room, being secured to the chassis on upper, left and right sides, and being open on bottom side, wherein said guiding panel is made of antistatic material.

7. The apparatus of claim 6, wherein an antistatic solution is applied to said guiding panel for preventing buildup of static charges.

8. The apparatus of claim 6, wherein the angle formed by said guiding panel with vertical is between 30°–45°.

9. The apparatus of claim 6, wherein the angle formed by said guiding panel with vertical is between 30°–45°.

10. An apparatus for guiding an air current of equipment used in a clean room, the apparatus comprising:
- a chassis for protecting equipment therein;
- a cooling fan for bringing warm air generated inside the chassis;
- a guiding panel being attached on one side of the chassis for guiding the warm air brought by the cooling fan to conform downwards to the direction of a vertical air flow in the clean room, being secured to the chassis on upper, left and right sides, and being open on bottom side, wherein an antistatic solution is applied to said guiding panel for preventing buildup of static charges.

* * * * *